US007502599B2

(12) United States Patent
Ben-Ayun et al.

(10) Patent No.: US 7,502,599 B2
(45) Date of Patent: Mar. 10, 2009

(54) CARTESIAN LOOP TRANSMITTER AND METHOD OF ADJUSTING AN OUTPUT LEVEL OF SUCH TRANSMITTER

(75) Inventors: Moshe Ben-Ayun, Shoham (IL); Izak Avayu, Mevaseret Tzion (IL); Mark Rozental, Gedera (IL)

(73) Assignee: Motorola, Inc., Schaumburg, IL (US)

( * ) Notice: Subject to any disclaimer, the term of this patent is extended or adjusted under 35 U.S.C. 154(b) by 240 days.

(21) Appl. No.: 10/563,466

(22) PCT Filed: May 20, 2004

(86) PCT No.: PCT/EP2004/050876

§ 371 (c)(1),
(2), (4) Date: Nov. 16, 2006

(87) PCT Pub. No.: WO2005/006542

PCT Pub. Date: Jan. 20, 2005

(65) Prior Publication Data

US 2007/0184789 A1    Aug. 9, 2007

(30) Foreign Application Priority Data

Jul. 4, 2003    (GB) ................................. 0315599.1

(51) Int. Cl.
*H01Q 11/12* (2006.01)
(52) U.S. Cl. ...................... 455/126; 455/127.1; 330/109
(58) Field of Classification Search .................. 455/90, 455/115, 116, 126, 127.1, 127.2, 127.3; 330/107, 330/109, 149
See application file for complete search history.

(56) References Cited

U.S. PATENT DOCUMENTS

| | | | | |
|---|---|---|---|---|
| 5,507,017 A | * | 4/1996 | Whitmarsh et al. | 455/126 |
| 5,675,286 A | * | 10/1997 | Baker et al. | 330/129 |
| 5,675,287 A | * | 10/1997 | Baker et al. | 330/129 |
| 5,977,824 A | | 11/1999 | Sparks | |
| 6,252,456 B1 | * | 6/2001 | Baker et al. | 330/207 P |
| 6,381,286 B1 | * | 4/2002 | Wilkinson et al. | 375/296 |
| 6,731,694 B2 | * | 5/2004 | Bozeki et al. | 375/297 |
| 6,970,684 B2 | * | 11/2005 | Haapakoski | 455/115.1 |
| 7,133,649 B2 | * | 11/2006 | Kanazawa et al. | 455/91 |
| 7,340,226 B2 | * | 3/2008 | Ben-Ayun et al. | 455/126 |
| 2002/0171476 A1 | | 11/2002 | Yamamoto | |
| 2003/0038675 A1 | * | 2/2003 | Gailus et al. | 330/107 |

FOREIGN PATENT DOCUMENTS

WO    WO 95/01009 A1    1/1995

* cited by examiner

*Primary Examiner*—Blane J Jackson
(74) *Attorney, Agent, or Firm*—Indira Saladi; Anthony P. Curtis

(57) ABSTRACT

A Cartesian loop transmitter having isolator eliminator circuitry is presented. The isolator eliminator circuitry includes a set of low pass and wide band pass as well as narrow band pass filters for each of I- and Q-channels, root mean square detectors and dividers connected to a means for comparing. Signals from the means for comparing are received by a microprocessor which controls attenuation setting. The output level of the transmitter is adjusted by generating a small signal measuring an on-channel signal level and a small signal level and then calculating a ratio of the small signal to the on-channel signal. The attenuation setting is increased if the ratio exceeds a defined threshold.

19 Claims, 2 Drawing Sheets

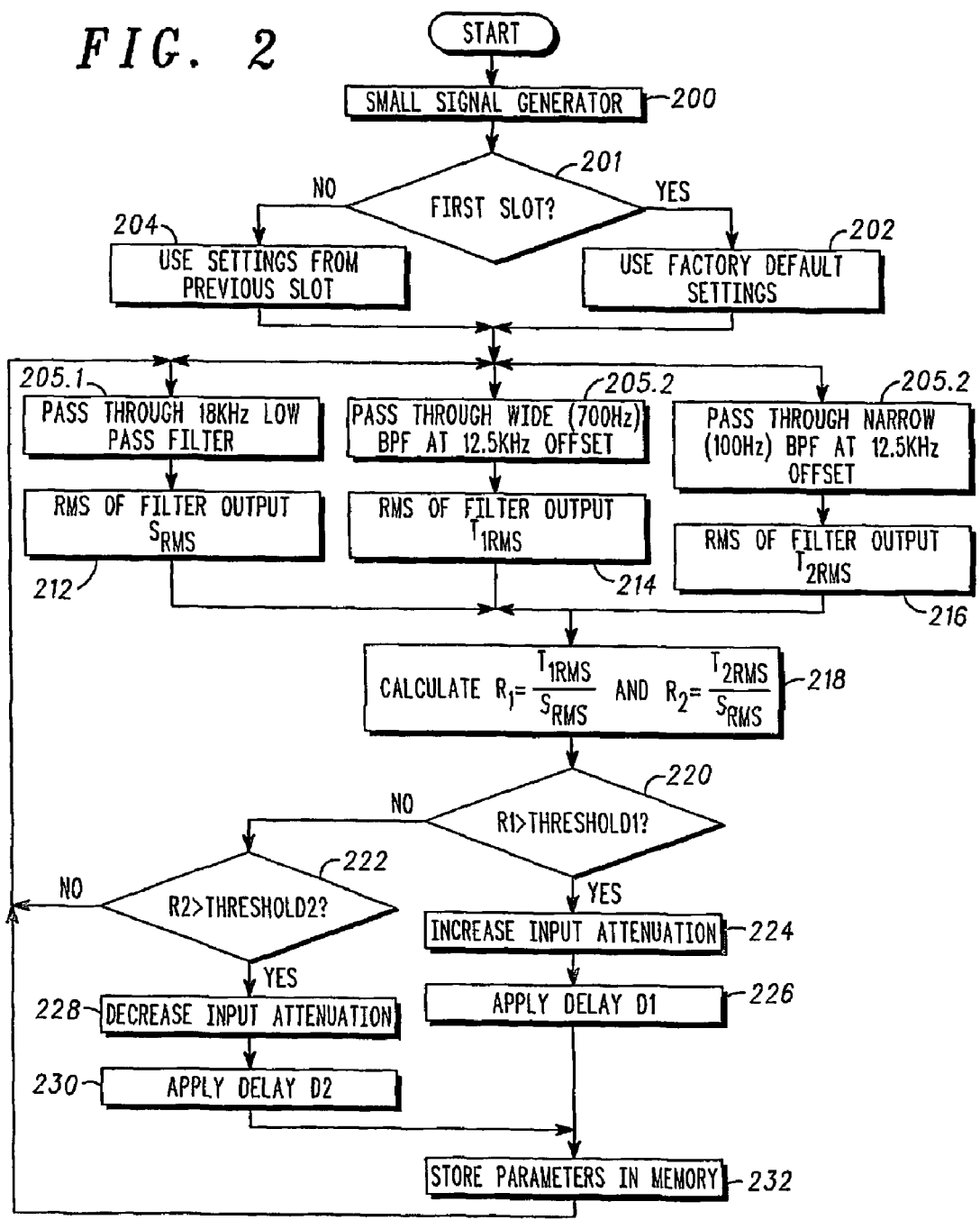
FIG. 2
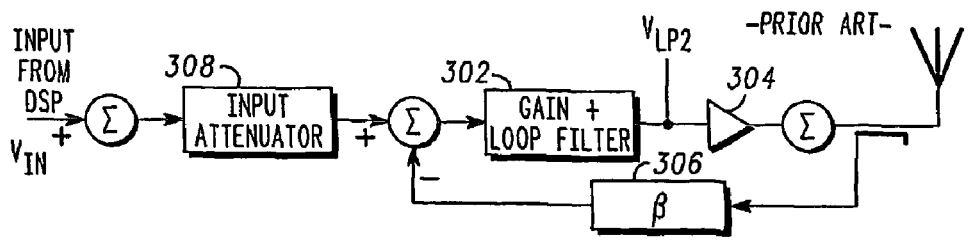
FIG. 3 —PRIOR ART—

CARTESIAN LOOP TRANSMITTER AND METHOD OF ADJUSTING AN OUTPUT LEVEL OF SUCH TRANSMITTER

PRIORITY

This application is the national stage of international application Serial No. PCT/EP2004/050876 filed on May 20, 2004, which claims the benefit of priority to Great Britain application Serial No. 0315599.1 filed on Jul. 4, 2003. Both of these applications are assigned to Motorola, Inc.

FIELD OF THE INVENTION

The present invention relates to radio linear transmitters. More specifically, it relates to a linear transmitter, whose stability of operation is maintained without an isolator and a method of adjusting an output level of such transmitter.

BACKGROUND OF THE INVENTION

Radio communication devices use antennas to provide for the efficient transmission of radio frequency (RF) communication signals. The transmitter portion of a communication device includes a power amplifier to amplify the radio frequency signals before they are coupled to the antenna for transmission. As modern radio communication systems work in narrow frequency bands the transmitters' circuitries require RF power amplifiers able to operate in a linear fashion. Linear amplification is required to prevent distortion of the modulated signal and minimizing the interference. However non-linearity of real world RF amplifiers appears when they are operated at high drive levels. Similar situations may be caused by operating conditions. For example, a transmitter operating near an electromagnetically reflective structure may be susceptible to energy reflected back through the antenna into the transmitter.

There are known in the art transmitters with improved linearity. One method of linearization of transmitters is to use a Cartesian feedback loop based linearizer. The Cartesian feedback linearizer allows maintaining linearity of the transmitter while still allowing RF power amplifier to work close to its saturation point thus maintaining good efficiency. To protect against changes in load impedance as a result of reflected energy, an isolator or circulator is often inserted between the antenna and the power amplifier. The isolator protects the power amplifier by absorbing the reflected energy and preventing it from reaching the amplifier. The isolator directs the reflected energy to an absorptive load termination. Although the isolator generally works well, it adds significant cost, size, and weight to the design of a radio communication device. Isolators are narrowband, expensive and have large physical dimensions (especially at low frequencies).

There are also known in the art Cartesian loop transmitters without isolators. One such example is described in US patent application no. US2003/0031271. In this document a method for isolator elimination is disclosed. In this prior art solution an isolator eliminator provides phase and level correction signals on the basis of samples of an information signal and a drive signal sampled from a feedback loop. These correction signals maintain stability the operation of the transmitter.

SUMMARY OF THE INVENTION

The term LP2 herein below refers to a point in the transmitter circuit located between loop poles and zeros and upmixer.

The term small signal herein below refers to any signal transmitted by the transmitter whose level is significantly below the baseband signal level.

There is a need for an apparatus and a method for adjusting an output level of a Cartesian loop transmitter which alleviate or overcome the disadvantages of the prior art.

According to a first aspect of the present invention there is thus provided a Cartesian loop transmitter comprising a forward path and a feedback path (each of these paths comprising an I-channel and a Q-channel) as well as an isolator eliminator, said transmitter comprising:

a first low pass filter and a first wide band pass filter connected to said I-channel at LP2;

a second low pass filter and a second wide band pass filter connected to said Q-channel at LP2;

a first root mean square detector collecting signal from said first wide band pass filter and from said second wide band pass filter;

a second root mean square detector collecting signal from said first low pass filter and from said second low pass filter;

a first divider connected to said first and said second root mean square detectors;

a means for comparing connected to said first divider and to a microprocessor connected to input attenuators on said I- and Q-channels.

Preferably said Cartesian loop transmitter further comprising a first narrow band pass filter connected to said I-channel at LP2 and a second narrow band pass filter connected to said Q-channel at LP2. Said two narrow band pass filters are connected to a third root mean square detector. Further a second divider is connected to said second and said third root mean square detectors and to said means for comparing.

According to a second aspect of the present invention there is thus provided a method of adjusting an output level of a Cartesian loop transmitter in a digital radio communication system. The method comprising the steps of generating a small signal at a predefined frequency offset and then applying a factory predefined attenuation setting for adjusting said output level if attenuation setting for a previous slot is not available or applying said attenuation setting obtained in previous slot for adjusting said output level in a current slot. Further steps are measuring an on-channel baseband signal level at LP2 and measuring said small signal level at a predefined frequency offset at LP2. In the following steps a first ratio of said small signal level to said on-channel baseband signal level is calculated. If said first ratio is above a first threshold then attenuation setting of an input signal is increased. In final step said attenuation setting is stored in a memory.

Preferably said on-channel baseband signal level is measured after filtering in low pass filter and said small signal level is measured after filtering in a wide band pass filter. Additionally said small signal level is also measured after filtering in a narrow band pass filter. Then a second ratio of said small signal level after filtering in said narrow band pass filter to said on-channel baseband signal level is calculated. If said second ratio is below a second threshold then said attenuation setting of an input signal is reduced.

Characteristics of a Radio Frequency Power Amplifier (e.g. Adjacent Channel Power (ACP), output power, etc.) change under influence of Voltage Standing Wave Ratio (VSWR). The present invention beneficially allows adjusting a Cartesian loop output power by monitoring said Radio Frequency Power Amplifier (RFPA) nonlinearity.

Advantages of the present invention include:
1) The method does not rely on specific RFPA behaviour versus VSWR. The invention allows monitoring of Cartesian linearization loop small signal gain and adjusts the input signal.
2) The method does not require RFPA characteristic factory tuning.
3) The method reduce power fast if Cartesian loop gain is reduced due to VSWR (signal after filtering in said wide bandpass filter is taken for calculations). When loop gain returns to normal power the gain increase is slower to improve accuracy (signal after filtering in said narrow bandpass filter is taken for calculations).

BRIEF DESCRIPTION OF THE DRAWINGS

The present invention will be understood and appreciated more fully from the following detailed description taken in conjunction with the drawings in which:

FIG. 2 is a flow chart illustrating a method of adjusting an output level of a Cartesian loop transmitter in accordance with an embodiment of the present invention;

FIG. 3 is a simplified diagram of a known in the art Cartesian feedback loop transmitter.

DETAILED DESCRIPTION OF AN EMBODIMENT OF THE INVENTION

Figure 1:
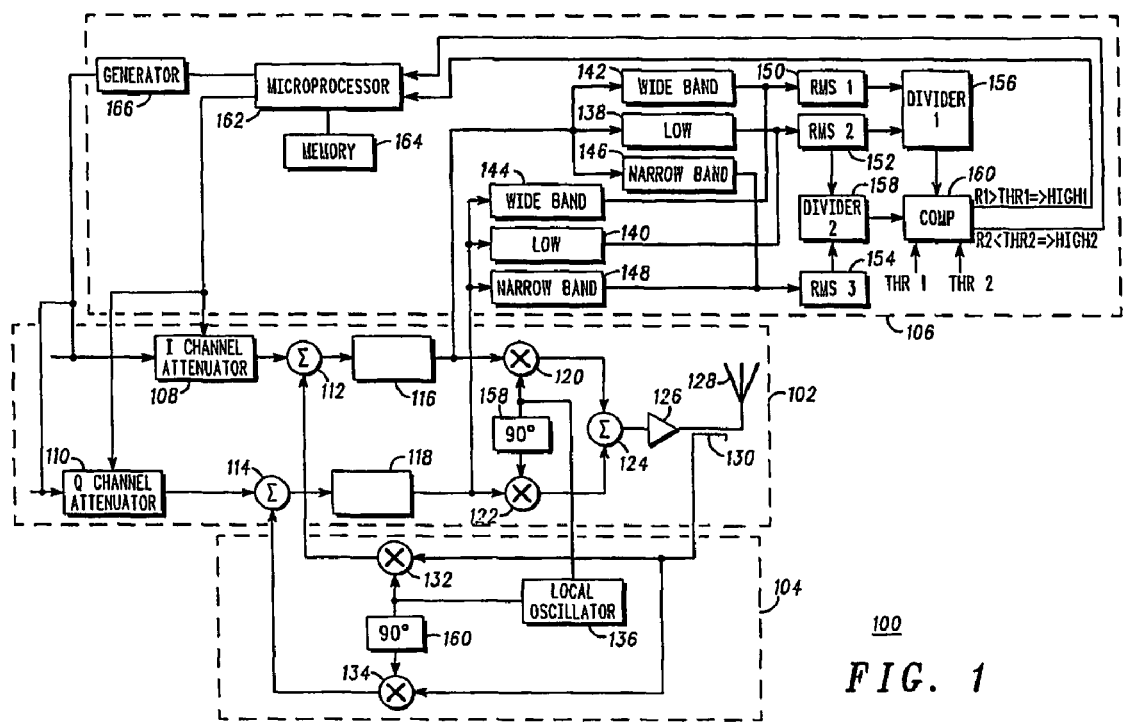
FIG. 1 is a schematic diagram illustrating a Cartesian loop transmitter in accordance with an embodiment of the present invention.

Referring to FIG. 1 a Cartesian loop transmitter circuit 100 according to one embodiment of the present invention is presented. Said Cartesian loop transmitter 100 incorporates a forward path 102, a feedback path 104 and an isolator eliminator 106. Said Cartesian loop transmitter 100 receives inputs at a baseband frequency in I- and Q-channels' attenuators, 108 and 110 respectively. Baseband signals from said attenuators 108 and 110 pass Cartesian loop summing junctions 112 and 114 to amplifiers and loop filters 116 and 118. Said baseband signals are then upconverted to radio frequency (RF) signals by upconverters 120 and 122. Said RF signals are then combined at a RF summer 124 and amplified by a Radio Frequency Power Amplifier (RFPA) 126 and then transmitted over the air from an antenna 128.

Said feedback path 104 is supplied with a feedback signal from a directional coupler 130 which takes part of said RF signal from said forward path 102. Said feedback signal from said directional coupler 130 is downconverted to said baseband frequency by downconverters 132 and 134.

A local oscillator (LO) 136 generates a continuous wave RF carrier at the RF transmit frequency. A signal from said LO 136 is then applied to an I-channel up-converter 120 and an I-channel down-converter 132. Said LO 136 signal is also applied to a Q-channel up-converter 122 through a first 90 degree phase shifter 158 and to a Q-channel down-converter 134 through a second 90 degree phase shifter 160.

After applying mixing to baseband in said down-converters 132, 134 said feedback signal is passed to said first summing junctions 112 and 114 respectively.

Said isolator eliminator 106 monitors transmitted signals at LP2, i.e. after amplifiers and loop filters 116 and 118 and before upconverters 120 and 122. Said. loop filters of 116 and 118 are baseband low pass filters that consist of poles and zeros.

With reference to FIGS. 1 and 2 said isolator eliminator 106 continuously collects an on-channel baseband signal as well as additionally transmitted small signal at a predefined frequency offset in relation to a transmission channel from both said I- and Q-channels.

In one embodiment (for TETRA communication system) where TETRA modulation bandwidth is +/−12.15 kHz the small signal frequency offset can be +12.5 kHz (or −12.5 kHz). Said small signal preferably must be located outside of desired modulation signal bandwidth. I-channel LP2 signal is filtered through a centered, first narrow band pass filter 146 (band width 100 Hz) and in parallel through a centered, first wide band pass filter 142 (band width 700 Hz) at +12.5 kHz (or −12.5 kHz) offset, whereas Q-channel LP2 signal is passed through a second narrow band pass filter 148 and a second wide band pass filter 144.

Said baseband signals from said I- and Q-channels are filtered by a first and a second 8 kHz band width low pass filters 138 and 140 respectively.

Then outputs from said wide band pass filters 142 and 144 and said narrow band pass filters 146 and 148 as well as said low pass filters 138 and 140 are passed through root mean square (RMS) detectors 150, 152 and 154 to a dividers 156 and 158. In a first divider 156 a first ratio of said small signal level after filtering in said wide band pass filters 142 and 144 to said on-channel baseband signal level is calculated. In a second divider 158 a second ratio of said small signal level after filtering in said narrow band pass filters 146 and 148 to said on-channel baseband signal level is calculated.

Results of said calculation are passed to a means for comparing 160. Said means for comparing 160 sends signal HIGH_1 if said first ratio (divider 156 output) exceeds a first threshold THR1. Signal HIGH_2 is sent if said second ratio (divider 158 output) is below a second threshold THR2. Signal LOW is sent if said first ratio is below or equal THR1 and said second ratio is above or equal THR2.

Said signal from said means for comparing 160 is received by a microprocessor 162, which controls said input attenuators 108 and 110 of said I- and Q-channels. If said signal from said means for comparing 160 is HIGH_1 said microprocessor 162 sends command to said input attenuators 108 and 110 to increase input attenuation setting 224 by a first constant value. If said signal from said means for comparing 160 is HIGH_2 said microprocessor 162 sends command to said input attenuators 108 and 110 to reduce 228 input attenuation setting by a second constant value.

Said microprocessor 162 applies then a first or a second delay 226 and 230 to execution of software, which based on next samples, calculates said first and said second ratio and increases or reduces said attenuation setting. Said first and said second delays are implemented by not reading results of said means for comparing 160 for defined period of time. Said first and said second delays are applied to ensure that after increasing said attenuation setting the output of other elements of the circuit, i.e. said filters 138, 140, 142, 144, 146 and 148 will be stable (filter step response transient effect will be over). Said first and said second delays' values can in one embodiment be equal and in another embodiment be different.

Said microprocessor 162 stores 232 said attenuation setting of said input attenuators 108 and 110 in a memory 164.

By using two types of band pass filters (narrow 146 and 148 as well as wide 142 and 144) it is possible to apply different rates of change of attenuation. As increasing attenuation fast in situation when Cartesian loop small signal gain is reduced due to VSWR is critical it is possible to use fast wide band pass filters 142 and 144 for calculation and decision on increasing attenuation 224. On the other hand reducing attenuation 228 is not critical and may be done slowly (and more accurately). For this purpose said small signal filtered in said narrow band pass filters 146 and 148 is used.

FIG. 2 shows a flow chart illustrating a method of adjusting an output level of a Cartesian loop transmitter 100 in a digital radio system according to one embodiment of the present invention.

In the first step 200 a small signal is generated at a predefined frequency offset. In one embodiment said small signal can be a sine wave tone. Said small signal is transmitted simultaneously with desired modulated TETRA signal. Said small signal level is about 30 dB below an on-channel signal level. In next step 201 it is checked whether said attenuation setting from previous slot are stored in said memory 164. If said data are available said Cartesian loop transmitter 100 is adjusted according to these setting 204. If this is a first slot in transmission and there are no said attenuation setting stored in said memory 164 a factory default setting is used 202 for adjusting said transmitter 100. When the transmitter 100 starts transmission said on-channel baseband signal level is measured 212 at LP2 after filtering in a low pass filter 205.1. Said small signal level is measured 214 and 216 after filtering in a wide band pass filter 205.2 and additionally after filtering in a narrow band pass filter 205.3.

Root mean square values of:
1) said on-channel signal level 212,
2) said small signal level after filtering in said narrow band pass filters 214,
3) said small signal level after filtering in said wide band pass filters 216 are taken for said measurement and for calculation of ratios of said small signal level to said on-channel baseband signal level 218.

If said first ratio is below or equal to said first threshold and said second ratio is above or equal to said second threshold then measurements of said on-channel baseband signal level 212 and said small signal level 214 and 216 are performed again.

If said first ratio exceeds said first threshold 220, said attenuation setting of said input attenuators 108 and 110 is increased 224 by a constant value. Additionally a first delay is applied 226 to execution of software, which based on next samples, calculates said ratio and increases said attenuation setting.

If said second ratio is below said second threshold 222, said attenuation setting of said input attenuators 108 and 110 is reduced 228 by a constant value. Additionally a second delay is applied 230 to execution of software, which based on next samples, calculates said ratio and increases said attenuation setting.

As during one time slot a plurality of samples are taken, the steps starting from measurement of said on-channel baseband signal level and of said small signal level 212 to 216 through step of storing 232 of said attenuation setting are performed in a loop.

Below, with reference to FIG. 3, which is a simplified diagram of a known Cartesian loop transmitter 300, is a short explanation of theoretical background of the method of adjusting the output level of Cartesian loop transmitter according to an embodiment of the present invention.

RFPA 304 is biased in class AB. Its stand alone Adjacent Channel Power (ACP) is around 30 dB at nominal output power (1 Watt at antenna). RFPA ACP is improved by the Cartesian loop gain (βA) at offset frequency of interest. Let assume that for 25 kHz offset a loop gain of 40 dB is designed. This means that close loop ACP at 25 kHz offset will be 30+40=70 dB. If said RFPA 304 is driven into compression by Voltage Standing Wave Ratio (VSWR) changes its small signal gain drops significantly. When such a RFPA 304 is driven into compression, while operating inside Cartesian feedback transmitter, the loop gain (βA) will drop by the same amount as RFPA 304 small signal gain drops. For example if under some VSWR RFPA small signal gain drops by 10 dB then the loop gain (βA) becomes 40−10=30 dB and resultant ACP at the antenna will be 30+30=60 dB. Resultant loop ACP will be degraded by the amount of RFPA small signal gain reduction.

With reference to FIG. 3 the transfer function between LP2 and TX signal input from Digital Signal Processor (DSP) can be examined.

$$\frac{V_{LP2}}{V_{in}} = \frac{ATT_{in} \cdot H(j\omega)}{1 + ATT_{in} \cdot H(j\omega) \cdot g \cdot \beta}$$

where $H(j\omega)$—is a loop filter transfer function;

β—is a loop feedback 306 gain;

g—is RFPA small signal gain, $V_{in}$—input voltage to the loop $V_{LP2}$—voltage after the loop filter 302

For $ATT_{in} \cdot H(j\omega) \cdot g \cdot \beta \gg 1$ it can be approximated $$\frac{V_{LP2}}{V_{in}} \approx \frac{1}{g \cdot \beta}$$

Note that g is RFPA 304 small signal gain.

From this transfer function we can see that if RFPA 304 gain drops due to VSWR the signal at LP2 will increase. This means that by looking at LP2 while transmitting we can estimate loop small signal gain change. It can be detected if said small signal gain of the loop drops and the drive to the loop can be reduced by increasing attenuation of input attenuators 308 that are located before the loop summing junction.

To accurately estimate loop small signal gain changes together with baseband signal a small signal is transmitted. The small signal is transmitted at +12.5 kHz (or −12.5 kHz) offset. The power of this small signal will be 30 dB below the baseband signal transmitted power. Under such conditions this small signal will not have any influence on baseband signal 25 kHz ACP. Said small signal is detected at LP2 by passing it through bandpass filter and its root mean square voltage is monitored.

Said generated small signal is always K (e.g. K=−30 dB) below the baseband signal power. So at the loop input:

$$\frac{P_{in}(\text{small signal})}{P_{in}(\text{baseband})} = K$$

At LP2 level of said baseband signal $P_{LP2}$ (baseband) and level of said small signal $P_{LP2}$ (small signal) are measured. Relation between ratios of input signals and signals measured at LP2 may be described as follow:

$$R = \frac{\frac{P_{LP2}(\text{small signal})}{P_{LP2}(\text{baseband})}}{\frac{P_{in}(\text{small signal})}{P_{in}(\text{baseband})}} = \frac{\frac{P_{LP2}(\text{small signal})}{P_{LP2}(\text{baseband})}}{K}$$

It is evident that in the linear region R will be equal to 1. But when RFPA will be driven into compression said small signal power at LP2 will increase and thus the ratio $$\frac{P_{LP2}(\text{small signal})}{P_{LP2}(\text{baseband})}$$

will increase. So in the compression region R will become larger then 1. Cartesian loop transmitter according to the present invention controls input loop attenuators for keeping the ratio R at some pre-defined range (between thresholds THR1 and THR2) and at the same time keeping ACP within limit.

In one embodiment, the isolator eliminator 106 is implemented in software executable on a Digital Signal Processor (DSP). A software implementation is relatively low cost and allows easy reconfiguration. However hardware implementation is also possible. Nevertheless, it will be appreciated that the present invention may be implemented hardware or software and may be used in radio communication devices.

The invention claimed is:

1. A Cartesian loop transmitter having a forward path and a feedback path, each of these paths comprising an I-channel and a Q-channel, as well as an isolator eliminator, said transmitter comprising:
    a) a first low pass filter and a first wide band pass filter connected to said I-channel at LP2;
    b) a second low pass filter and a second wide band pass filter connected to said Q-channel at LP2;
    c) a first root mean square detector collecting signals from said first wide band pass filter; and from said second wide band pass filter;
    d) a second root mean square detector collecting signals from said first low pass filter and from said second low pass filter;
    e) a first divider connected to said first and said second root mean square detectors to produce a first ratio using signals from said first and said second root mean square detectors; and
    f) a means for comparing connected to said first divider, the means for comparing comparing the first ratio to a first threshold, the means for comparing providing a signal; and
    g) a digital system connected to input attenuators on said I- and Q-channels and to the means for comparing, the digital system controlling an attenuation setting of the transmitter based on the signal from the means for comparing.

2. The Cartesian loop transmitter according to claim 1 further comprising:
    a) a first narrow band pass filter connected to said I-channel at LP2;
    b) a second narrow band pass filter connected to said Q-channel at LP2;
    c) a third root mean square detector collecting signals from said first narrow band pass filter and from said second narrow band pass filter; and
    d) a second divider connected to said second and said third root mean square detectors and to said means for comparing, the second divider producing a second ratio using signals from said second and third second root mean square detectors, the means for comparing comparing the second ratio to a second threshold.

3. The Cartesian loop transmitter according to claim 1 wherein a memory storing the attenuation setting is connected to said digital system.

4. The Cartesian loop transmitter according to claim 1 wherein a generator generating a small signal at a predefined frequency offset in relation to a transmission channel of the transmitter is connected to said digital system.

5. The Cartesian loop transmitter according to claim 4 wherein said generator is a sine wave generator.

6. The transmitter according to claim 1 wherein the transmitter is operable to provide communications in at least one of the following communication systems: TETRA, GSM, and IDEN.

7. The transmitter according to claim 1 further comprising attenuators in each of the I- and Q-channel paths, the digital system connected to the attenuators such that the attenuation setting is applied to the attenuators by the digital system.

8. The transmitter according to claim 1 wherein the attenuation is increased if the first ratio is larger than the first threshold.

9. The transmitter according to claim 2 wherein the attenuation is decreased if the second ratio is less than the second threshold.

10. The transmitter according to claim 2 wherein after changing the attenuation setting, the digital system delays calculating the first and second ratios based on next samples by amounts dependent on whether the attenuation setting is increased or decreased.

11. A method of adjusting an output level of a Cartesian loop transmitter in a digital radio system, the method comprising the steps of:
    a) generating a small signal at a predefined frequency offset in relation to a transmission channel;
    b) applying a factory predefined attenuation setting for adjusting said output level if an attenuation setting for a previous slot is not available, or
    c) applying said attenuation setting obtained in previous slot for adjusting said output level in a current slot;
    d) measuring an on-channel baseband signal level at LP2;
    e) measuring a small signal level of said small signal at a predefined frequency offset at LP2;
    f) calculating a first ratio of said small signal level to said on-channel baseband signal level; and
    g) increasing an attenuation setting of an input signal if said first ratio is above a first threshold; and
    h) storing said attenuation setting of an input signal in a memory.

12. The method according to claim 11 wherein said small signal level is measured after filtering in a wide band pass filter.

13. The method according to claim 11 wherein said on-channel signal level is measured after filtering in a low pass filter.

14. The method according to claim 11 further comprising steps:
    e1) measuring said small signal level after filtering in a narrow band pass filter at said predefined frequency offset at LP2;
    f1) calculating a second ratio of said small signal level after filtering in said narrow band pass filter to said on-channel baseband signal level; and g1) reducing said attenuation setting of an input signal if said second ratio is below a second threshold.

15. The method according to claim 14 wherein steps d) through h) are repeated in a loop while said first ratio and said second ratio are between said first and said second thresholds and while there is a modulated signal to transmit.

16. The method according to claim 14 wherein for determining at least one of said first or said second ratio, root mean square values of said on-channel baseband signal level and said small signal level are taken.

17. The method according to claim 14 wherein after increasing said attenuation setting, execution of software is delayed by a first delay, the software calculating said first and said second ratio and increasing said attenuation setting based on next samples.

18. The method according to claim 14 wherein after reducing said attenuation setting, execution of software is delayed by a second delay, the software calculating said first and said second ratio and reducing said attenuation setting based on next samples.

19. The method according to claim 11 wherein said small signal is generated on a level significantly below said on-channel signal level.

\* \* \* \* \*